(12) United States Patent
Kao et al.

(10) Patent No.: US 7,477,072 B1
(45) Date of Patent: Jan. 13, 2009

(54) CIRCUIT FOR AND METHOD OF ENABLING PARTIAL RECONFIGURATION OF A DEVICE HAVING PROGRAMMABLE LOGIC

(75) Inventors: Sean Kao, Campbell, CA (US); Arifur Rahman, San Jose, CA (US); James Anderson, Santa Cruz, CA (US)

(73) Assignee: XILINX, Inc., San Jose, CA (US)

( * ) Notice: Subject to any disclaimer, the term of this patent is extended or adjusted under 35 U.S.C. 154(b) by 46 days.

(21) Appl. No.: 11/333,972

(22) Filed: Jan. 17, 2006

(51) Int. Cl.
*H01L 25/00* (2006.01)
*H03K 19/177* (2006.01)

(52) U.S. Cl. .......................... 326/41; 326/40
(58) Field of Classification Search ............. 326/37–47; 365/154
See application file for complete search history.

(56) References Cited

U.S. PATENT DOCUMENTS

| | | | |
|---|---|---|---|
| 5,336,950 A * | 8/1994 | Popli et al. | 326/39 |
| 6,353,551 B1 * | 3/2002 | Lee | 365/154 |
| 6,525,562 B1 * | 2/2003 | Schultz et al. | 326/39 |
| 7,109,751 B1 * | 9/2006 | de Jong | 326/40 |

* cited by examiner

*Primary Examiner*—Rexford Barnie
*Assistant Examiner*—Crystal L Hammond
(74) *Attorney, Agent, or Firm*—John J. King

(57) ABSTRACT

A circuit for enabling partial reconfiguration of memory elements of a device having programmable logic is described. The circuit comprises a block of memory cells comprising a look-up table of a configurable logic block; and a reset signal coupled to the block of memory elements, the reset signal enabling partial reconfiguration of the memory cells of the configurable logic block. Each the memory cell may be coupled to receive the reset signal enabling the partial reconfiguration of the block of memory cells of the configurable logic block. The reset signal may comprise a plurality of signals, wherein each signal of the plurality of signals is coupled to a memory cell of the block of memory cells. Each memory cell may also receive a signal for setting an initial state. A method of enabling partial reconfiguration of memory cells of a look-up table of a programmable logic device is also described.

17 Claims, 7 Drawing Sheets

CIRCUIT FOR AND METHOD OF ENABLING PARTIAL RECONFIGURATION OF A DEVICE HAVING PROGRAMMABLE LOGIC

FIELD OF THE INVENTION

The present invention relates generally to devices having programmable logic, and in particular, to a circuit for and a method of enabling a partial reconfiguration of a device having programmable logic.

BACKGROUND OF THE INVENTION

A programmable logic device (PLD) is designed to be user-programmable so that users may implement logic designs of their choices. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. In some CPLDs, configuration data is stored on-chip in non-volatile memory, then downloaded to volatile memory as part of an initial configuration sequence.

Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA.

For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

PLDs and systems including PLDs also have different "modes" depending on the operations being performed on them. A specific protocol allows a PLD to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g., a programmable ROM (PROM), an erasable PROM (EPROM), an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block. At the end of the start-up, the PLD is now specialized to the user's design, and the PLD enters into "user" mode as part of its normal operation.

Function generators comprising look-up table random access memories (LUT RAMs) are currently employed as building blocks for configurable logic blocks, and provide pipelining structures such as LUT RAM-based shift registers. The function generators can be selected to have different functions which are selected by configuration data bits downloaded in a configuration bitstream and loaded into configuration memory. For example, a function generator may be implemented as a LUT RAM (also commonly called distributed RAM) or a shift register. An example of a look-up table is a 16:1 multiplexer with the four inputs serving as binary select lines, and the sixteen values programmed into the look-up table serving as the data being selected. When implemented as a shift register, each input to the multiplexer is coupled to an associated flip-flop that makes up the overall logic cell. The addressable bit of the shift register may be stored in the flip-flop for a synchronous output, or may be fed directly to a combinatorial output of a CLB. A RAM-based shift register module provides a very efficient multi-bit wide shift register for use in FIFO-like applications or as a delay line or time skew buffer. Fixed-length shift registers and variable-length shift registers may be created. Accordingly, using LUT RAM-based shift registers may improve performance and rapidly lead to cost savings in circuits requiring shift registers.

However, all such LUT structures of conventional programmable logic devices may be reset globally only at initial configuration. Thus, a reset option is not available during or subsequent to a partial reconfiguration cycle of a programmable logic circuit, resulting in instantiated configurations nominally initialized to unknown state. While a partial reconfiguration of a PLD may be achieved in a conventional device by changing the configuration bits to change the configuration of one or more CLBs, the states of the memory cells of the LUT structures are not changed. That is, it is possible in conventional devices to change the states of configuration memory cells that determine the configuration of a CLB, but it is not possible to change the state of the memory cells of the LUT structures which are left with irrelevant data. Therefore, the state of LUT structures is essentially unmanageable in any partially reconfigurable design employing these structures, resulting in an un-mappable logic resource. Within the context of Self-Reconfiguring Platform (SRP) processing, a correct state must be maintained across all partial reconfiguration cycles. In SRAM-based FPGAs, configuration resources may be reused as stateful structures, (i.e., logic-level resources possessing state), as typified by LUT-RAMs, shift registers, etc. Such structures may prove highly efficient/compact within context of design synthesis and mapping. However, these structures do not possess logically-exposed reset inputs (i.e., a reset for which there exists an explicit datapath representation). Therefore, conventional programmable logic circuits may not be initialized to a known state subsequent to a partial reconfiguration cycle. This leads to practical difficulties for use of these structures within the context of an SRP design implementation.

Accordingly, there is a need for an improved circuit for and method of enabling partial reconfiguration of memory cells of a programmable logic device.

SUMMARY OF THE INVENTION

A circuit for enabling partial reconfiguration of memory cells of a device having programmable logic is described. The circuit comprises a block of memory cells comprising a look-up table of a configurable logic block; and a reset signal coupled to the block of memory elements, the reset signal enabling resetting memory cells of the look-up table during a partial reconfiguration of the programmable logic. Each memory cell may be coupled to receive the reset signal enabling the partial reconfiguration of the block of memory cells of the configurable logic block. The reset signal may comprise a plurality of signals, wherein each signal of the plurality of signals is coupled to a memory cell of the block of memory cells. Each memory cell may also receive a signal for setting an initial state of the memory cell.

A method of enabling partial reconfiguration of memory cells of a programmable logic device is also described. The method comprises steps of coupling a reset signal to a look-up table of a configurable logic block; resetting memory cells of the look-up table; and reconfiguring the look-up table of the configurable logic block. The step of coupling a reset signal to a look-up table of a configurable logic block preferably comprises a step of coupling a predetermined reset signal to each memory cell of the look-up table. The method further comprises a step of setting initial values to memory cells of the look-up table. The step of reconfiguring the look-up table comprises a step of performing a partial reconfiguration of the programmable logic device during operation of the programmable logic device. Finally, the step of performing a partial reconfiguration of the device may comprise a step of performing a self-reconfiguration or performing an external reconfiguration.

DETAILED DESCRIPTION OF THE DRAWINGS

Figure 1:
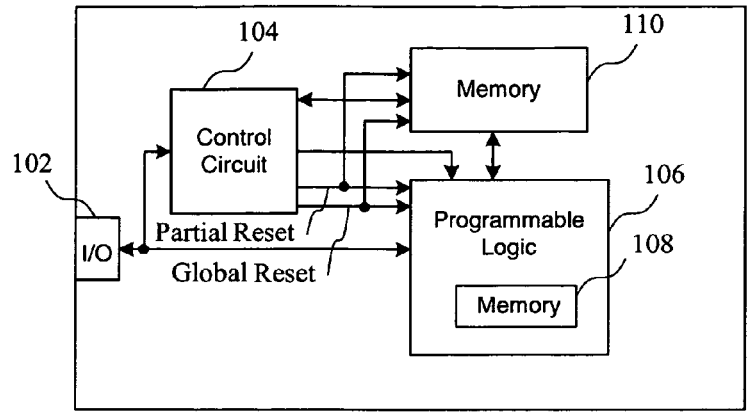
FIG. 1 is a block diagram of a circuit having memory according to an embodiment the present invention.

Turning first to FIG. 1, a block diagram of a circuit having memory according to an embodiment the present invention is shown. The circuit of FIG. 1 preferably comprises an integrated circuit 100 having an input/output port 102 coupled to a control circuit 104 enabling self reconfiguration and a programmable logic circuit 106. The programmable logic circuit comprises gates which are configurable by a user of the circuit to implement a circuit design of the user. The circuits implemented in the programmable logic circuit are implemented according to configuration data downloaded to the integrated circuit 100. As will be described in more detail below, the programmable logic circuit comprises configuration memory 108. Generally, configuration memory 108 comprises memory cells for configuring the programmable logic based upon the configuration data. Although a single programmable logic circuit 106 is shown, it should be understood that the programmable logic circuit 106 may comprise a plurality of programmable logic circuits. Similarly, although a single configuration memory 108 is shown, a given programmable logic circuit may comprise a plurality of memory blocks having memory cells. Also, configuration memory 108 may be either volatile memory or non-volatile memory, or a programmable logic circuit may include both volatile and non-volatile memory. Finally, the circuit may comprise a memory 110, external to the programmable logic circuit, which may either be volatile or non-volatile memory, or a combination thereof. The circuit of FIG. 1 may be any device having programmable logic, such as a programmable logic device described above, or any integrated circuit having programmable logic, such as an application-specific integrated circuit (ASIC) having a portion of circuits which is programmable. According to one aspect of the embodiment of FIG. 1, both a global reset and a partial reset signal may be coupled to memory elements, as will be described in more detail below.

Figure 2:
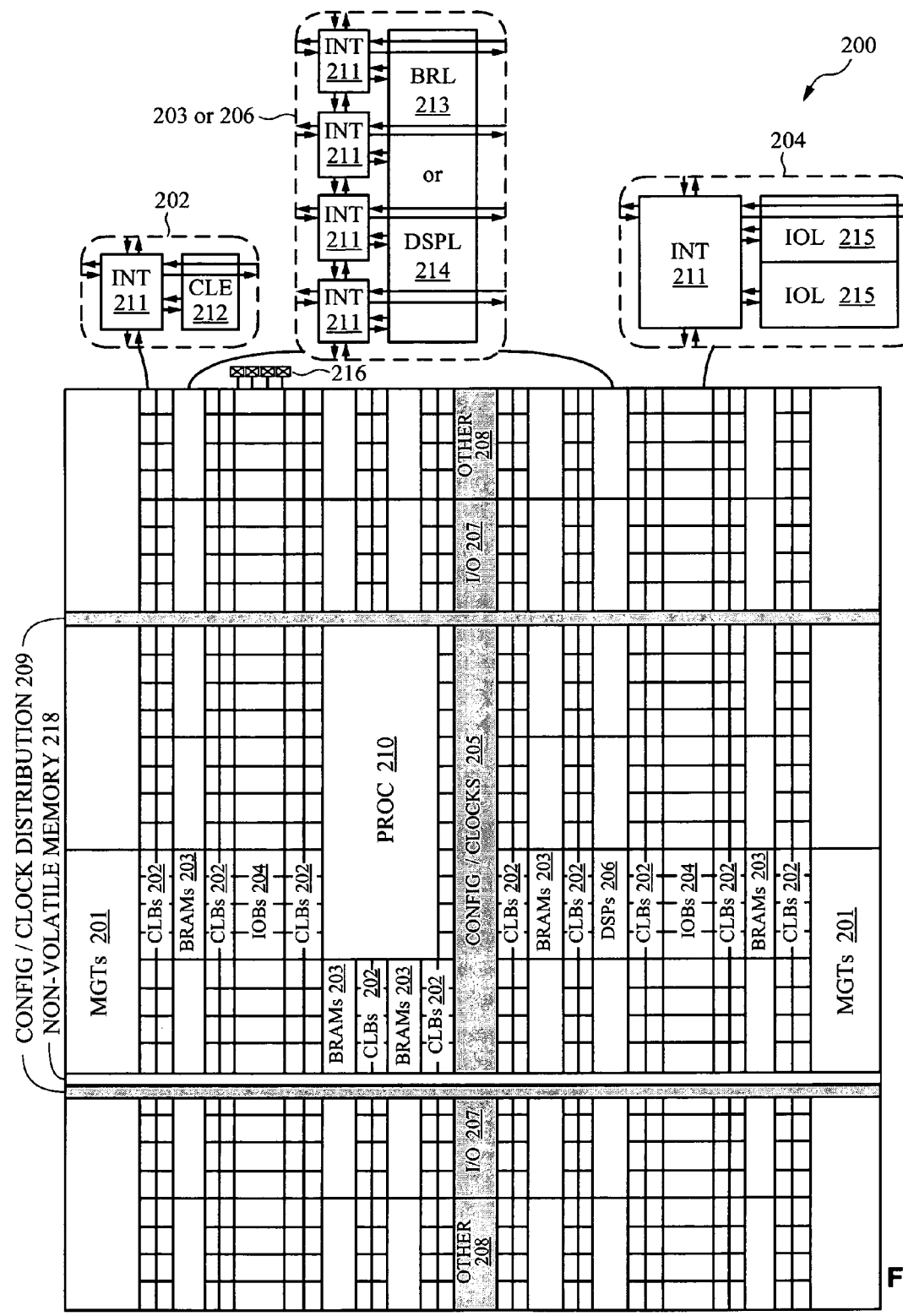
FIG. 2 is a block diagram of a field programmable gate array according to an embodiment of the present invention.

Turning now to FIG. 2, a block diagram of a field programmable gate array 200 according to an embodiment of the present invention is shown. The circuit of FIG. 1 may be implemented in the FPGA of FIG. 2. For example, control circuit 104 may be implemented in a processor or other control circuit of the FPGA, while the programmable logic 106 and corresponding memory 108 may be implemented in a configurable logic block which will be described in more detail below. The FPGA architecture 200 of FIG. 2 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include one or more dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 may include a configurable logic element (CLE 212) that may be programmed to implement user logic plus a single programmable interconnect element (INT 211). A BRAM 203 may include a BRAM logic element (BRL 213) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. The memory 110 of FIG. 1 may be implemented in a BRAM. A DSP tile 206 may include a DSP logic element (DSPL 214) in addition to an appropriate number of programmable interconnect elements. An IOB 204 may include, for example, two instances of an input/output logic element (IOL 215) in addition to one instance of the programmable interconnect element (INT 211). As will be clear to those of skill in the art, the actual I/O pads 216 connected, for example, to the I/O logic element 215 are manufactured using metal layered above the various illustrated logic blocks, and typically are not confined to the area of the input/output logic element 215. For example, the global reset signals and partial reset signals may be generated internally by the processor 210 or coupled to the FPGA by way of the I/O pads 216.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. Some FPGAs utilizing the architecture illustrated in FIG. 2 include additional logic blocks that disrupt the regular columnar structure making up a large part of the FPGA. The additional logic blocks may be programmable blocks and/or dedicated logic. For example, the processor block PROC 210 shown in FIG. 2 spans several columns of CLBs and BRAMs. Finally, a non-volatile memory 218 may be employed for on-chip storage of configuration data which is used to configure the configuration logic blocks or other programmable tiles as described above.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of programmable logic device, having configuration memory.

Figure 3:
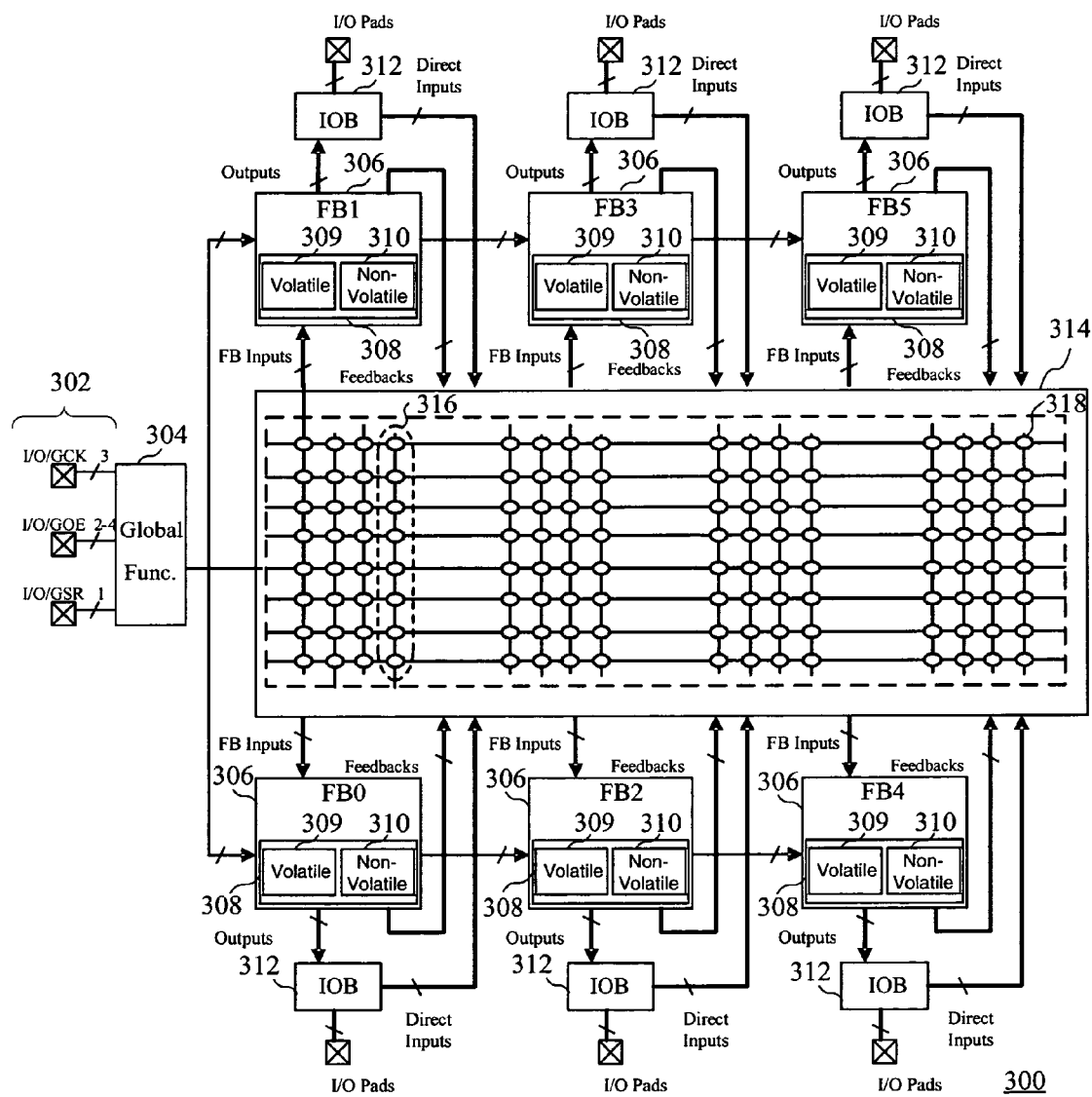
FIG. 3 is a block diagram of a complex programmable logic device according to an embodiment of the present invention.

Turning now to FIG. 3, a block diagram of a complex programmable logic device 300 according to an embodiment of the present invention is shown. As described above with respect to the FPGA of FIG. 2, the elements of FIG. 1 may be implemented in a CPLD. The CPLD comprises a plurality of input/output pads 302 coupled to a global functions block 304, which may provide clock signals to the remaining portions of the CPLD and enable routing of data to and from the internal circuits of the CPLD. The CPLD further comprises a plurality of function blocks 306 (FB0 through FB5), which comprise blocks of programmable logic. Each function block of the CPLD typically includes a two-level AND/OR structure similar to those used in Programmable Logic Arrays (PLAs) and Programmable Array Logic (PAL) devices, as is well known in the art. Each of the function blocks preferably comprises configuration memory 308, which may comprise volatile memory 309 and/or non-volatile memory 310. For example, the programmable logic 106 and memory 108 of FIG. 1 may be implemented in the function block 306, while the global reset signals may be generated internally or coupled to the CPLD by way of I/O pads.

The function blocks are connected together and to input/output blocks 312 by a programmable interconnection array 314. The programmable interconnection array includes many multiplexer circuits 316, each including several PIPs 318. In each multiplexer circuit 316, only one PIP 318 is enabled. The enabled PIP selects one of the many input signals provided to the interconnection array, and the selected input signal is provided as the output signal from the multiplexer circuit 316. Further information on CPLDs may be found, for example, in U.S. Pat. No. 6,466,049 B1 by Sholeh Diba et al., issued Oct. 15, 2002, which is hereby incorporated herein by reference in its entirety.

Figure 4:
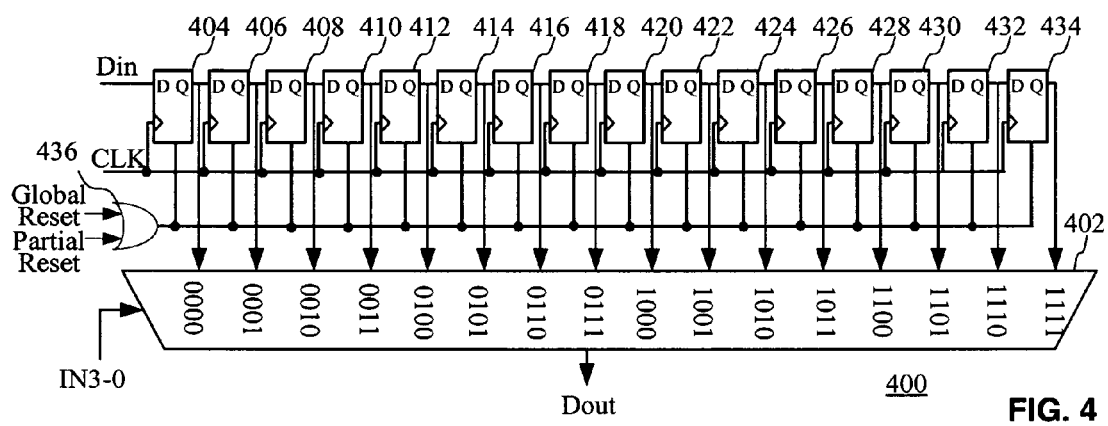
FIG. 4 is a block diagram of a shift register having a global reset input and a partial reset input according to an embodiment of the present invention.

Turning now to FIG. 4, a block diagram of a shift register having a global reset input and a partial reset input according to an embodiment of the present invention is shown. In particular, a multiplexer 402, shown here as a 16-1 multiplexer, comprises a plurality of inputs coupled to receive outputs of a plurality of registers 404-434. An input (IN0-3) selects one of the sixteen inputs. A Partial Reset signal is coupled to the shift register via an OR gate 436 also coupled to receive a Global Reset signal. Accordingly, a Partial Reset signal may then be logically exposed as a datapath port accessible by the operating system of the chip and embedded applications. Although a single Partial Reset signal for resetting all of the registers of the shift register of FIG. 4 is shown, a multi-bit signal may be employed to selectively reset predetermined registers as will be described in more detail below.

Figure 5:
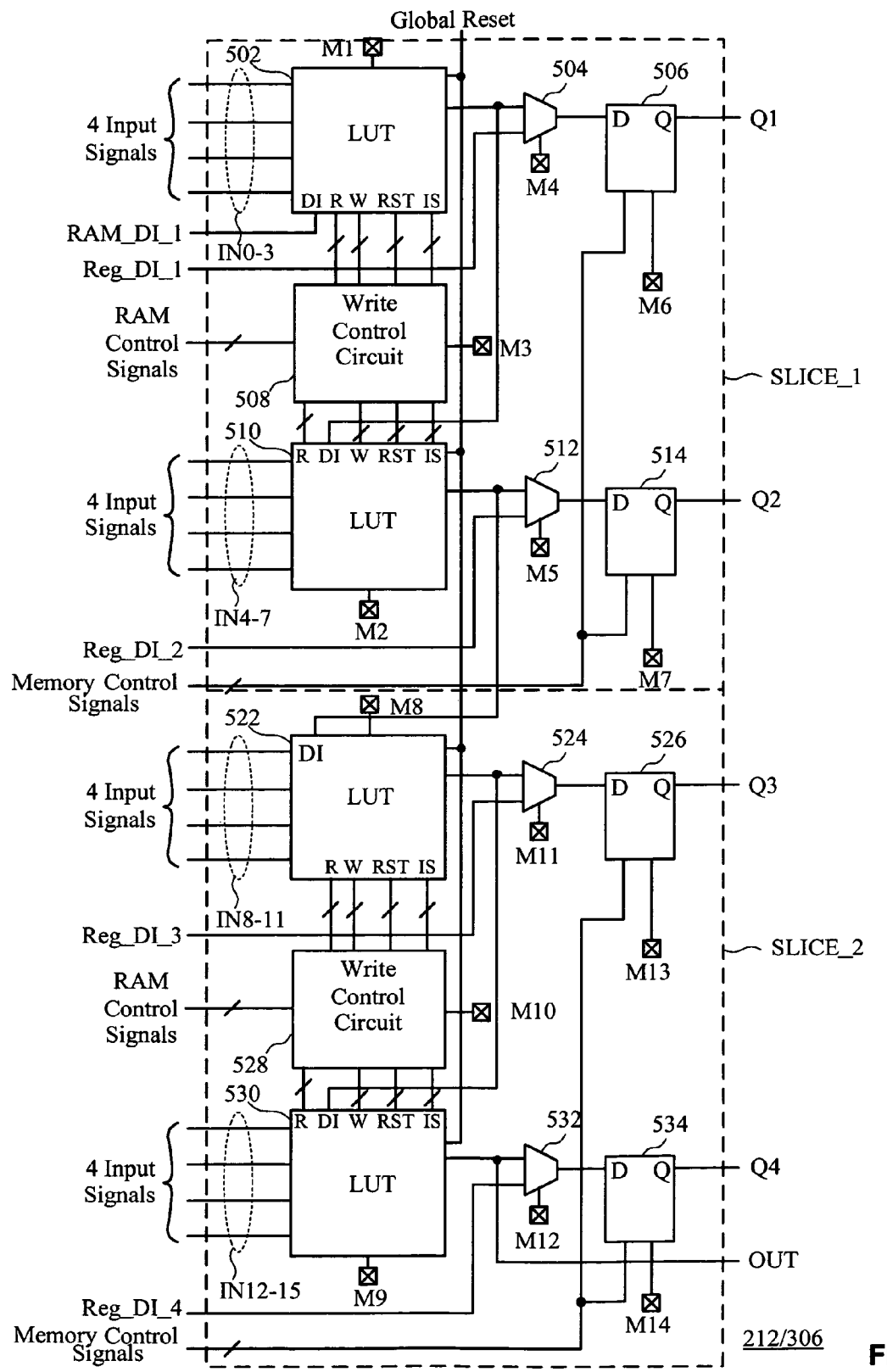
FIG. 5 is a block diagram of a configurable logic element according to an embodiment of the present invention.

Turning now to FIG. 5, a block diagram of a configurable logic element according to an embodiment of the present invention is shown. In particular, FIG. 5 illustrates in simplified form a configurable logic element of a configuration logic block 202 of FIG. 2. The configurable logic element shown comprises two similar slices, where each slice comprises a pair of function generators. However, the configurable logic element may comprise fewer or more slices, such as four slices. Each function generator may function in any of several modes depending upon the configuration data in the configuration memory elements M1-M14. As set forth above, the configuration memory elements M1-M14 may be changed during a partial reconfiguration of an FPGA to change the mode of the function generator. When in RAM mode, input data is supplied by an input terminal RAM_DI_1 to the data input (DI) terminal of the associated function generator. Each function generator provides an output signal to an associated multiplexer, which selects between the output signal function generator and an associated register direct input signal Reg_DI_1, Reg_DI_2 from the programmable interconnect element. Thus, each function generator may be optionally bypassed. When in look-up table mode, each function generator implemented as a look-up table has four data input signals IN0-IN3. Slice 1 comprises a function generator implemented as a LUT 502 coupled to a multiplexer 504. In particular, the LUT 502 receives 4 input signals which are decoded to generate an output associated with data stored in the LUT at the address designated by the input signals. The multiplexer 504 is adapted to receive the output of LUT 502 and a registered value of Reg_DI_1. The output of the multiplexer 504 is coupled to a register 506 which generates an output Q1.

A Write Control Circuit 508 is coupled to receive RAM control signals and generate signals to control the LUT 502. In addition to a data input (DI) coupled to receive RAM_DI_1 and conventional read and write control signals coupled to a read enable input (R) and a write enable input (W), the LUT 502 comprises a partial reset input (RST) for receiving a partial reset signal, and an initial state input (IS) for receiving an initial state signal. As will be described in more detail below in reference to FIGS. 6-10, the partial reset signal enables resetting one or more of the bits of the LUT 502, while the initial state input signal may also be applied to selectively set one or more of the bits of the LUT 502. Such resetting of the memory elements enables resetting the LUT memory cells during a partial reconfiguration of a programmable logic device, including partial reconfiguration of a device during operation. Similarly, slice 1 comprises a function generator implemented as a LUT 510 coupled to a multiplexer 512. The LUT 510 is adapted to receive input signals IN4-IN7, while the multiplexer 512 is coupled to receive the output of the LUT 510 and a registered value of Reg_DI_2. The output of the multiplexer 512 is coupled to a register 514 which generates an output Q2. The write control circuit 508 also generates a partial reset signal and an initial state signal for selectively resetting or setting one or more of the bits of the LUT 510. One advantage of resetting LUT memory elements of a device during partial reconfiguration is that it is not necessary to cycle through the required clock cycles to set the correct data after the partial reconfiguration.

Similarly, slice 2 comprises a function generator implemented as a LUT 522 coupled to a multiplexer 524. The LUT 522 is adapted to receive input signals IN8-IN11, while the multiplexer 524 is coupled to receive the output of the LUT 522 and a registered value of Reg_DI_3. The output of the multiplexer 524 is coupled to a register 526 which generates an output Q3. A Write Control Circuit 528 is coupled to receive RAM control signals and generate signals to control the LUT 522. In particular, input signals IN8-IN11 are decoded to generate an output associated with data stored in the LUT at the address designated by the input signals. The LUT 522 comprises a partial reset input (RST) for receiving a partial reset signal, and an initial state input (IS) for receiving an initial state signal. Similarly, slice 2 comprises a function generator implemented as a LUT 530 coupled to a multiplexer 532. The LUT 530 is adapted to receive input signals IN12-IN15, while the multiplexer 532 is coupled to receive the output of the LUT 530 and a registered value of Reg_DI_4. The output of the multiplexer 532 is coupled to a register 534 which generates an output Q4. The write control circuit 528 also generates a partial reset signal and an initial state signal for selectively resetting or setting one or more of the bits of the LUT 530. As shown, the two slices may be combined to provide a 64-1 multiplexer. When implemented as shift registers, the function generators may operate as described above with respect to FIG. 4.

Figure 6:
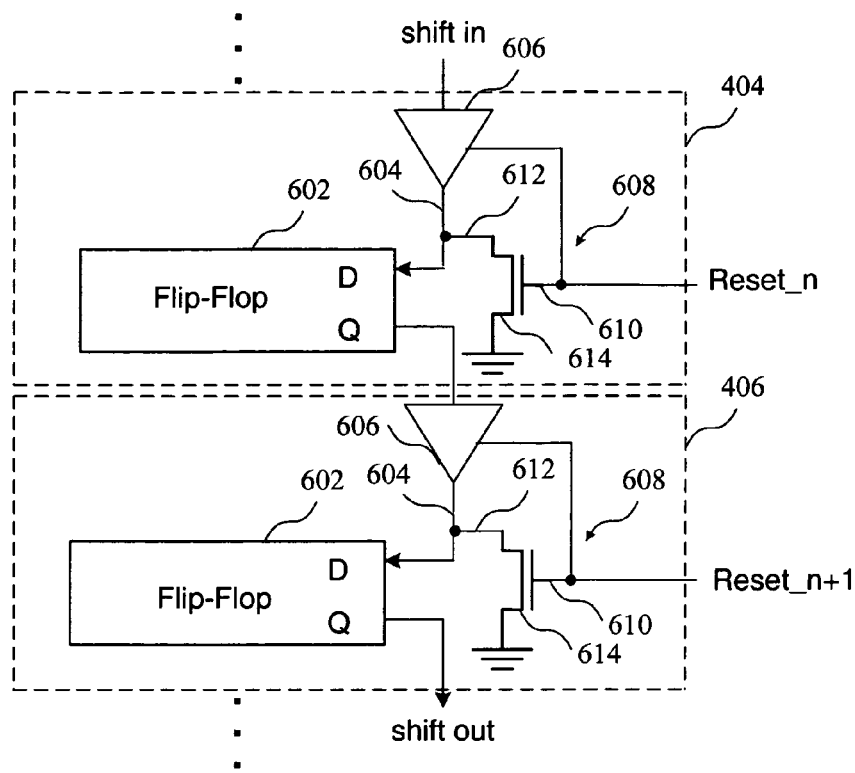
FIG. 6 is a block diagram of a shift register having a tri-state reset buffer according to an embodiment of the present invention.

Turning now to FIG. 6, a block diagram of a shift register having a tri-state reset buffer according to an embodiment of the present invention is shown. While a reset, such as a global reset, may be available in some circumstances, it is possible that no reset for a given shift register is available. If no reset is available, a partial reset signal, shown in FIG. 6 as a Reset_n and Reset_n+1 for each of the two registers 404 and 406, may be provided by a tri-state buffer and a pull-down transistor. In particular, each register of the embodiment of the FIG. 6 comprises a D flip-flop having a D input coupled to an output 604 of a tri-state buffer 606. A transistor 608 functioning as a pull-down transistor comprises a gate 610 coupled to receive a Reset signal associated with a specific register. A first conducting terminal 612 of the transistor 608 is coupled to the output 604 while a second conducting terminal 614 is coupled to ground. When the Reset signal associated with a given register is high, the transistor will pull the input terminal to ground, setting the input to the flip-flop to zero on the next clock signal. The Reset signal preferably comprises a plurality of bits (e.g., Reset_n, Reset_n+1, etc.), enabling the individual registers to be reset individually. Accordingly, a reset signal need not be provided to each and every shift register, but may be provided only where needed to enable partial reconfiguration of a circuit.

Figure 7:
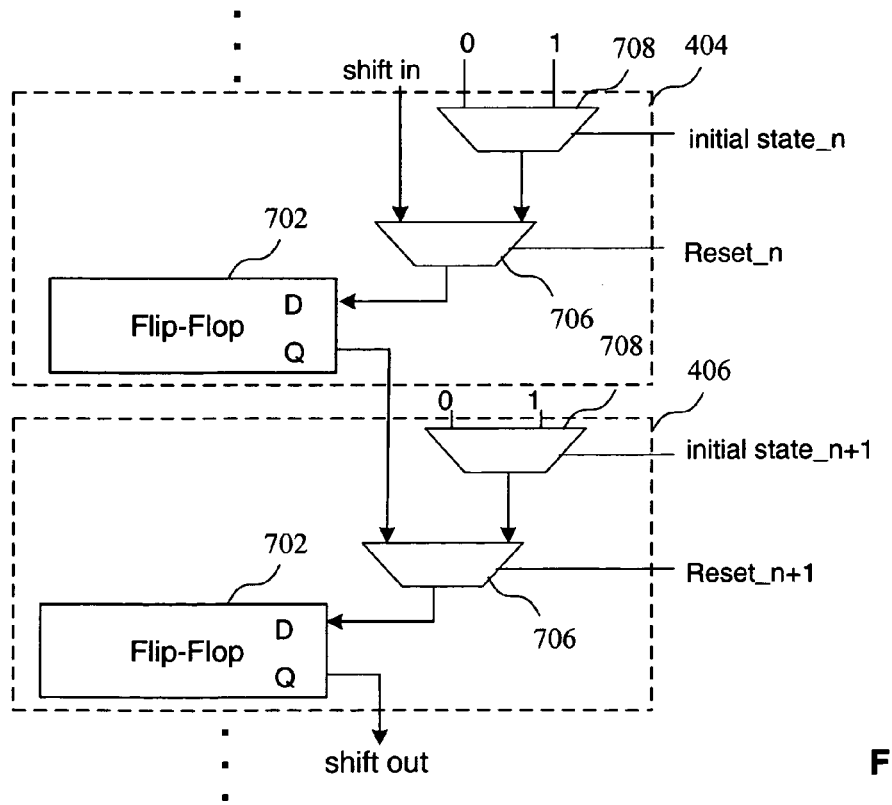
FIG. 7 is a block diagram of a shift register having a state specifying input according to an embodiment of the present invention.

Turning now to FIG. 7, a block diagram of a shift register having a state specifying input according to an embodiment of the present invention is shown. According to the embodiment of FIG. 7, a partial reset signal or some specific state provided by way of an Initial State signal may be applied to the shift register structure via the addition of two multiplexers. As will be described below, the embodiment of FIG. 7 provides a complete state-management solution. In particular, each register 404-434 comprises a D flip flop 702 coupled to receive the output of a first multiplexer 706. The multiplexer 706 receives a "shift in" signal (or an output of an adjacent register for registers after the first register of the series of registers), and an output of a second multiplexer 708 generating an output of either a "1" or a "0." During normal operation, each register receives the shift in signal for the first register or the output of an adjacent register for each other register. During a partial reset, a Reset signal comprising a bit coupled to each of the plurality of registers 404-434 selects the output of the multiplexer 708 as the output for multiplexer 706. The output of the multiplexer 708 comprises an initial state for the register of either a "1" or a "0." According to the embodiment of FIG. 7, not only is the flip-flop reset, but the initial state may be set to a predetermined value, enabling a partial reset of some or all of the registers to a selected state.

Figure 8:
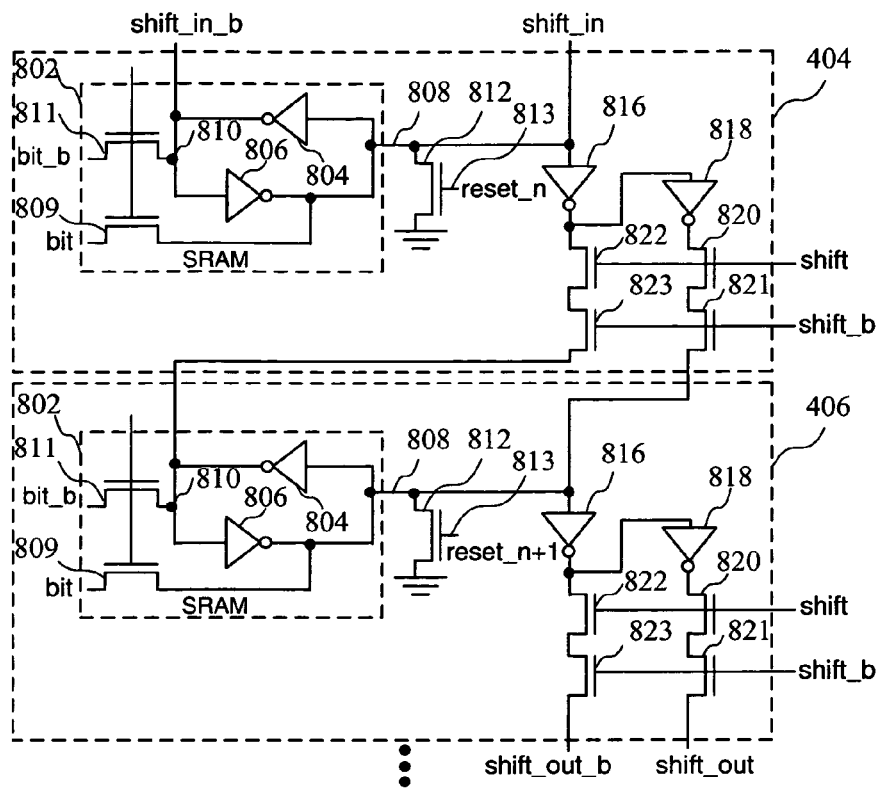
FIG. 8 is an SRAM-based shift register with a reset according to an embodiment of the present invention.
Figure 9:
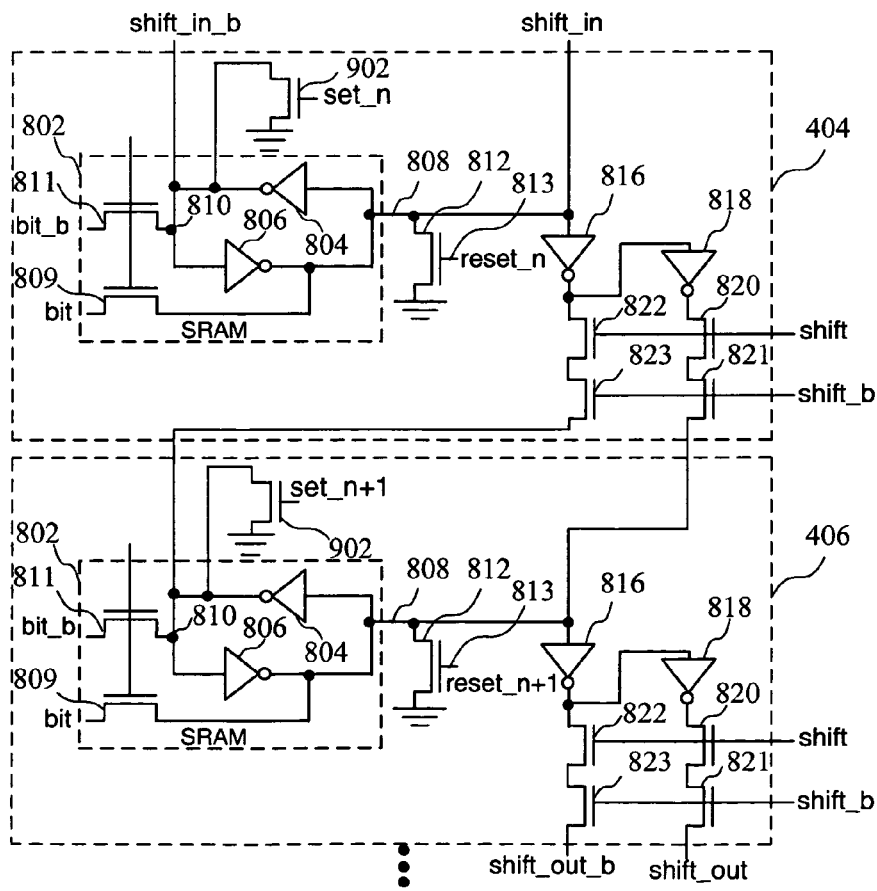
FIG. 9 is an SRAM-based shift register having a state specifying input according to an embodiment of the present invention.

Turning now to FIG. 8, an SRAM-based shift register with a reset according to an embodiment of the present invention is shown. In particular, each register 404-434 comprises a memory element 802 having a pair of cross-coupled inverters 804 and 806. The pair of inverters are coupled between a first node 808 coupled to receive a "bit" signal by way of a transistor 809 and a second node 810 coupled to receive an inverted bit signal "bit_b" by way of the transistor 811. The shift_in signal is coupled to the node 808. A reset transistor 812 receives a reset signal, shown as Reset_n for register 404 for example, at a control terminal 813 to provide a conductive path between node 808 and ground. The reset signal is used to reset the voltage at node 808 to ground. The node 808 is also coupled to a series of inverters comprising inverters 816 and 818. The output of inverter 818 is coupled to series transistors 820 and 821 which are coupled to receive a shift and shift_b signal, respectively, and output a shift_out signal coupled to node 808 of the next register 406. The series transistors 822 and 823, which receive the shift signal and shift_b signal, respectively, are coupled to the output of inverter 816 to enable generating shift_out_b signal coupled to node 810 of the next register 406. In a memory element where the inverters 804 and 806 comprises two transistors resulting in a six transistor cell, only a single additional transistor (e.g., transistor 812) is needed to provide reset functionality, and therefore provide partial reset capability for the circuit implementing the registers 404-434. As shown in the embodiment of FIG. 9, an additional transistor 902, for each register 404-434, coupled to the node 810 enables full state-management functionality. That is, the value stored in the memory element 802 for each of the registers 404-434 may be selected individually. A global reset may also be provided to the circuits of FIGS. 8 and 9, as is well known in the art. For example, the bit and bit_b signals may be pulled low to reset all of the registers. Alternatively, each individual reset signal may be pulled high to reset all of the registers. Finally, a global reset signal may be coupled to the reset transistors receiving the partial reset signal by employing an OR gate as shown in FIG. 2.

Figure 10:
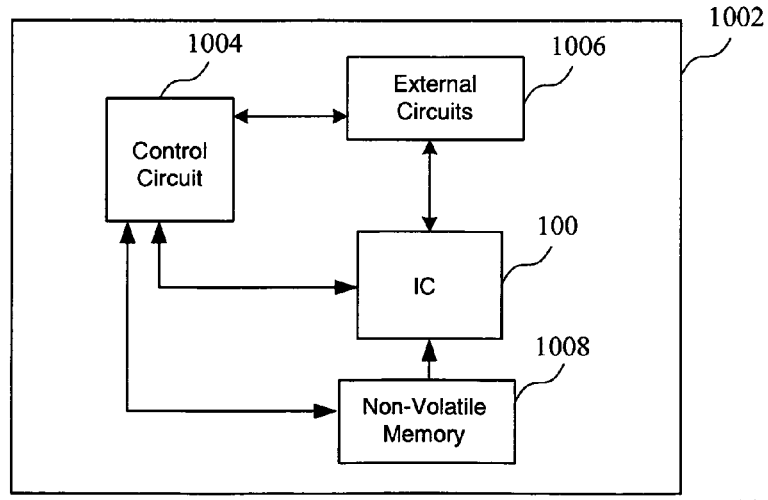
FIG. 10 is a block diagram of a circuit implementing the circuit 100 of FIG. 1 according to an embodiment of the present invention.

Turning now to FIG. 10, a block diagram of a circuit implementing integrated circuit 100 of FIG. 1 according to an embodiment of the present invention is shown. The circuit 1000 comprises a circuit board 1002 having a control circuit 1004. The control circuit 1004 may be, for example, a microprocessor or other integrated circuit for controlling external circuits 1006, integrated circuit 100, and a non-volatile memory 1008. Depending upon the type of device employing programmable logic which is used, the control circuit 1004 may be implemented on the integrated circuit 100. By allowing users to reset memory cells, it is possible to partially reconfigure a programmable logic device of the integrated circuit 100 as described above. That is, board-level devices external to the integrated circuit 100, such as external circuits 1006, may enable an external partial reconfiguration of the integrated circuit programmable logic.

Figure 11:
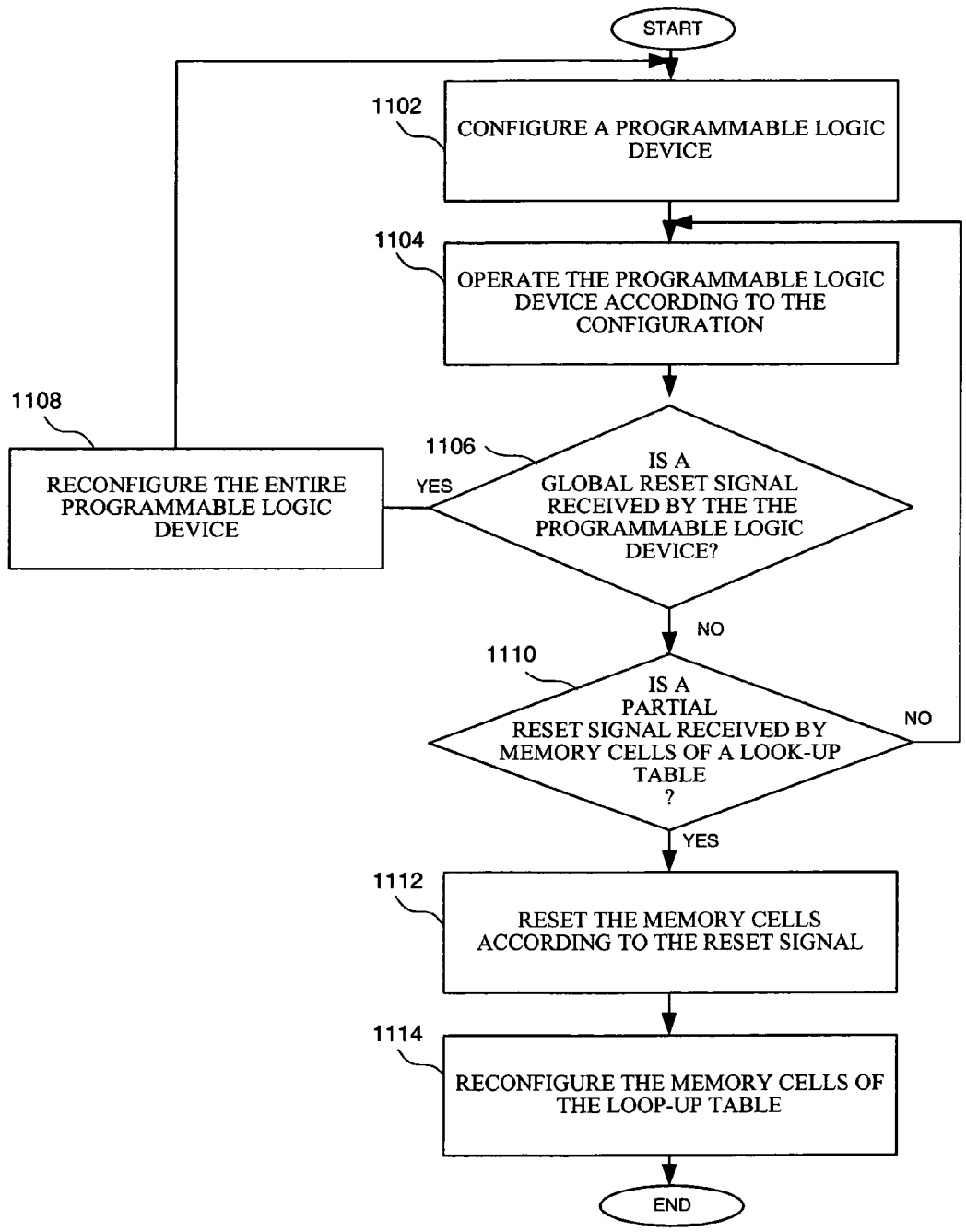
FIG. 11 is a flow chart showing a method of enabling partial reconfiguration of a memory according to an embodiment the present invention.

Turning now to FIG. 11, a flow chart shows a method of enabling partial reconfiguration of a memory according to an embodiment the present invention. The method of FIG. 11 may be employed using any of the circuits of FIGS. 1-10, or other suitable circuits. A programmable logic device is configured at a step 1102. The programmable logic device is operated according to the configuration at a step 1104. It is then determined whether a global reset signal is received by the configurable logic block of the programmable logic device at a step 1106. The entire programmable logic device is then reconfigured at a step 1108. It is then determined whether a partial reset signal is received by a portion of the memory cells of a look-up table of the programmable logic device at a step 1110. A portion of memory cells is reset at a step 1112. The portion of memory cells is then reconfigured at a step 1114. The steps of providing a global reset or a partial reset may be repeated as necessary.

The circuits and methods of the present application enable partial reconfiguration of memory elements of look-up tables of programmable logic circuits, and initialization of stateful configuration-plane structures subsequent to partial reconfiguration. As set forth above, the addition of an ancillary reset mechanism to a conventional LUT RAM circuit enables resetting registers of the LUT RAM of a programmable circuit, and initialization to a known state after partial reconfiguration. In particular, the reset circuit enabling partial reset is preferably logically-exposed, user-defined, and with explicit datapath representation to the LUT-RAMs and all derivative structures. Further, a circuit enabling ability to writing exact states to the memory cells of the LUT RAM are also preferably logically-exposed, user-defined, and with explicit datapath representation. The circuits are particularly suitable for SRP partial reconfiguration. Although some circuits described below relate to programmable logic devices, and programmable logic devices find particular application for the circuits and methods of enabling partial reconfiguration of a memory, the circuits and methods may be employed in any integrated circuit having memory. It can therefore be appreciated that the new and novel circuit for and method of enabling a partial reconfiguration of memory elements has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A circuit for enabling partial reconfiguration of memory elements of a device having programmable logic, said circuit comprising:
 a block of memory cells comprising a look-up table of a configurable logic block;
 a reset signal comprising a plurality of reset bits coupled to a first plurality of nodes of said block of memory cells, wherein each reset bit resets a value stored in a corresponding memory cell inside said look-up table by coupling a voltage to a data input of said corresponding memory cell storing said value, and
 a set signal comprising a plurality of set bits coupled to a second plurality of nodes of said block of memory cells, wherein each set bit sets a corresponding memory cell inside said look-up table, said reset bits and said set bits enabling selectively resetting and setting initial values for memory cells inside said look-up table during partial reconfiguration of said device.

2. The circuit of claim 1 wherein each memory cell of said block of memory cells is coupled to receive said reset signal.

3. The circuit of claim 1 wherein said set signal sets an initial state of predetermined memory cells inside said block of memory cells.

4. The circuit of claim 1 wherein said set signal comprises, for each memory cell inside said block of memory cells, a signal for setting an initial state of said memory cell.

5. The circuit of claim 1 wherein said set signal comprises a signal for setting an initial state of memory cells inside said block of memory cells, said signal for setting an initial state of memory cells comprising a plurality of signals having an initial state for each memory cell inside said block of memory cells.

6. The circuit of claim 1 further comprising a circuit for receiving said device having programmable logic, said circuit resetting memory cells inside said look-up table.

7. The circuit of claim 1 wherein said block of memory cells comprises a plurality of static random access memory cells.

8. The circuit of claim 7 wherein said plurality of static random access memory cells is coupled to receive said set signal for setting an initial state of said plurality of static random access memory cells.

9. The circuit of claim 1 wherein said block of memory cells comprises a shift register.

10. The circuit of claim 1 further comprising a global reset coupled to said block of memory cells.

11. A circuit for enabling partial reconfiguration of memory elements of a device having programmable logic, said circuit comprising:
 means for storing data in a look-up table of said device;
 means for receiving a signal for resetting said data stored in said look-up table during partial reconfiguration of said device, said signal for resetting comprising a plurality of signals, wherein each signal of said plurality of signals resets data stored in a corresponding memory cell inside said look-up table by coupling a voltage to a data input of said memory cell storing said data in said look-up table;
 means for selectively resetting predetermined bits of said data stored in said look-up table during said partial reconfiguration of said device;
 means for receiving a signal for setting said data stored in said look-up table during partial reconfiguration of said device, said signal for setting comprising a plurality of signals, wherein each signal of said plurality of signals sets data stored in a corresponding memory cell inside said look-up table; and
 means for selectively setting predetermined bits of said data stored in said look-up table during said partial reconfiguration of said device.

12. The circuit of claim 11 further comprising means for enabling partial reconfiguration of said device.

13. A method of enabling partial reconfiguration of memory elements of a device having programmable logic, said method comprising the steps of:
 coupling a reset signal to a first plurality of nodes for controlling memory cells inside a look-up table of a configurable logic block, said reset signal comprising a plurality of signals, wherein each signal of said plurality of signals couples a voltage to a data input of a corresponding memory cell inside said look-up table to store a value in said memory cell;
 resetting predetermined memory cells inside said look-up table during a partial reconfiguration of said device;

coupling a set signal to a second plurality of nodes for controlling memory cells inside said look-up table of said configurable logic block, said set signal comprising a plurality of signals, wherein each signal of said plurality of signals couples a voltage to a corresponding memory cell inside said look-up table to store a value in said memory cell; and reconfiguring said look-up table of said configurable logic block by setting said predetermined memory cells to predetermined values during a partial reconfiguration.

14. The method of claim 13 wherein said step of coupling a reset signal to said plurality of nodes for controlling memory cells inside a look-up table of a configurable logic block comprises a step of coupling a predetermined reset signal to each memory cell inside said look-up table.

15. The method of claim 13 wherein said step of reconfiguring said look-up table comprises a step of performing a partial reconfiguration of said programmable logic during the operation of the device.

16. The method of claim 15 wherein said step of performing a partial reconfiguration of said programmable logic comprises a step of performing a self-reconfiguration.

17. The method of claim 15 wherein said step of performing a partial reconfiguration of said programmable logic comprises a step of performing an external reconfiguration.

* * * * *